United States Patent
Nakatani et al.

(10) Patent No.: US 10,720,324 B2
(45) Date of Patent: Jul. 21, 2020

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Kimihiko Nakatani, Toyama (JP);
Hiroshi Ashihara, Toyama (JP);
Hajime Karasawa, Toyama (JP);
Kazuhiro Harada, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/656,862

(22) Filed: Jul. 21, 2017

(65) Prior Publication Data
US 2018/0033607 A1    Feb. 1, 2018

(30) Foreign Application Priority Data

Jul. 26, 2016 (JP) .................. 2016-146506

(51) Int. Cl.
*H01L 21/02* (2006.01)
*C23C 16/30* (2006.01)
(Continued)

(52) U.S. Cl.
CPC ........ *H01L 21/0228* (2013.01); *C23C 16/045* (2013.01); *C23C 16/30* (2013.01);
(Continued)

(58) Field of Classification Search
None
See application file for complete search history.

(56) References Cited

U.S. PATENT DOCUMENTS

2010/0151682 A1   6/2010   Moriya et al.
2010/0240217 A1   9/2010   Kushibiki et al.
(Continued)

FOREIGN PATENT DOCUMENTS

JP    2010-141223 A    6/2010
JP    2010-219105 A    9/2010
(Continued)

OTHER PUBLICATIONS

Korean Office Action issued on Jul. 30, 2018 for the Korean Patent Application No. 10-2017-0093347.
(Continued)

*Primary Examiner* — Alexander G Ghyka
(74) *Attorney, Agent, or Firm* — Volpe and Koenig, P.C.

(57) ABSTRACT

A method of manufacturing a semiconductor device is provided. The method includes forming a film on a substrate by causing a first precursor and a second precursor to intermittently react with each other by repeating a cycle a plurality of times, the cycle alternately performing supplying the first precursor, which satisfies an octet rule and has a first pyrolysis temperature, to the substrate and supplying the second precursor, which does not satisfy the octet rule and has a second pyrolysis temperature lower than the first pyrolysis temperature, to the substrate. In the act of forming the film, a supply amount of the first precursor is set larger than a supply amount of the second precursor.

15 Claims, 6 Drawing Sheets

(51) Int. Cl.
*C23C 16/455* (2006.01)
*C23C 16/04* (2006.01)
*C23C 16/52* (2006.01)

(52) U.S. Cl.
CPC .. *C23C 16/45531* (2013.01); *C23C 16/45546* (2013.01); *C23C 16/45563* (2013.01); *C23C 16/45578* (2013.01); *C23C 16/52* (2013.01); *H01L 21/02167* (2013.01); *H01L 21/02211* (2013.01)

(56) References Cited

U.S. PATENT DOCUMENTS

| | | | |
|---|---|---|---|
| 2011/0263105 A1 | 10/2011 | Hasebe et al. | |
| 2011/0269315 A1* | 11/2011 | Hasebe | C23C 16/22 438/758 |
| 2012/0321791 A1 | 12/2012 | Suzuki et al. | |
| 2014/0264555 A1* | 9/2014 | Ahn | H01L 21/28255 257/327 |
| 2016/0013042 A1 | 1/2016 | Hashimoto et al. | |
| 2016/0196970 A1* | 7/2016 | Takamure | H01L 21/02129 438/784 |

FOREIGN PATENT DOCUMENTS

| | | |
|---|---|---|
| JP | 2011-254063 A | 12/2011 |
| JP | 2012-186275 A | 9/2012 |
| JP | 2013-021301 A | 1/2013 |
| JP | 2014-222777 A | 11/2014 |
| KR | 20160006631 A | 1/2016 |

OTHER PUBLICATIONS

Korean Office Action dated Feb. 27, 2019 for the Korean Patent Application No. 10-2017-0093347.
Japanese Office Action dated May 28, 2019 for the Japanese Patent Application No. 2016-146506.

\* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2016-146506, filed on Jul. 26, 2016, the entire contents of which are incorporated herein by reference.

TECHNICAL FIELD

The present disclosure relates to a method of manufacturing a semiconductor device, a substrate processing apparatus, and a recording medium.

BACKGROUND

One process of manufacturing a semiconductor device, such as a process of forming a film on a substrate, is often carried out by supplying a plurality of precursors to the substrate so as to react with each other.

SUMMARY

Some embodiments of the present disclosure provide a technique capable of enhancing step coverage of a film formed on a substrate.

According to one embodiment of the present disclosure, there is provided a method of manufacturing a semiconductor device. The method includes forming a film on a substrate by causing a first precursor and a second precursor to intermittently react with each other by repeating a cycle a plurality of times. The cycle includes alternately performing: supplying the first precursor, which satisfies an octet rule and has a first pyrolysis temperature, to the substrate; and supplying the second precursor, which does not satisfy the octet rule and has a second pyrolysis temperature lower than the first pyrolysis temperature, to the substrate. In the act of forming the film, a supply amount of the first precursor is set larger than a supply amount of the second precursor.

According to another embodiment of the present disclosure, there is provided a substrate processing apparatus. The substrate includes a process chamber in which a substrate, a first precursor supply system configured to supply a first precursor, which satisfies an octet rule and has a first pyrolysis temperature, to the substrate in the process chamber, a second precursor supply system configured to supply a second precursor, which does not satisfy the octet rule and has a second pyrolysis temperature lower than the first pyrolysis temperature, to the substrate in the process chamber, and a control part configured to control the first precursor supply system and the second precursor supply system to perform in the process chamber forming a film on the substrate by causing the first precursor and the second precursor to intermittently react with each other by repeating a cycle a plurality of times. The cycle includes alternately performing supplying the first precursor to the substrate; and supplying the second precursor to the substrate, wherein in the act of forming the film, a supply amount of the first precursor is set larger than a supply amount of the second precursor.

According to another embodiment of the present disclosure, there is provided a non-transitory computer-readable recording medium storing a program that causes a substrate processing apparatus to perform a process by a computer in a process chamber of the substrate processing apparatus. The process includes forming a film on a substrate by causing a first precursor and a second precursor to intermittently react with each other by repeating a cycle a plurality of times. The cycle includes alternately performing supplying the first precursor, which satisfies an octet rule and has a first pyrolysis temperature, to the substrate, and supplying the second precursor, which does not satisfy the octet rule and has a second pyrolysis temperature lower than the first pyrolysis temperature to the substrate. In the act of forming the film, a supply amount of the first precursor is set larger than a supply amount of the second precursor.

DETAILED DESCRIPTION

One Embodiment of the Present Disclosure

Figure 1:
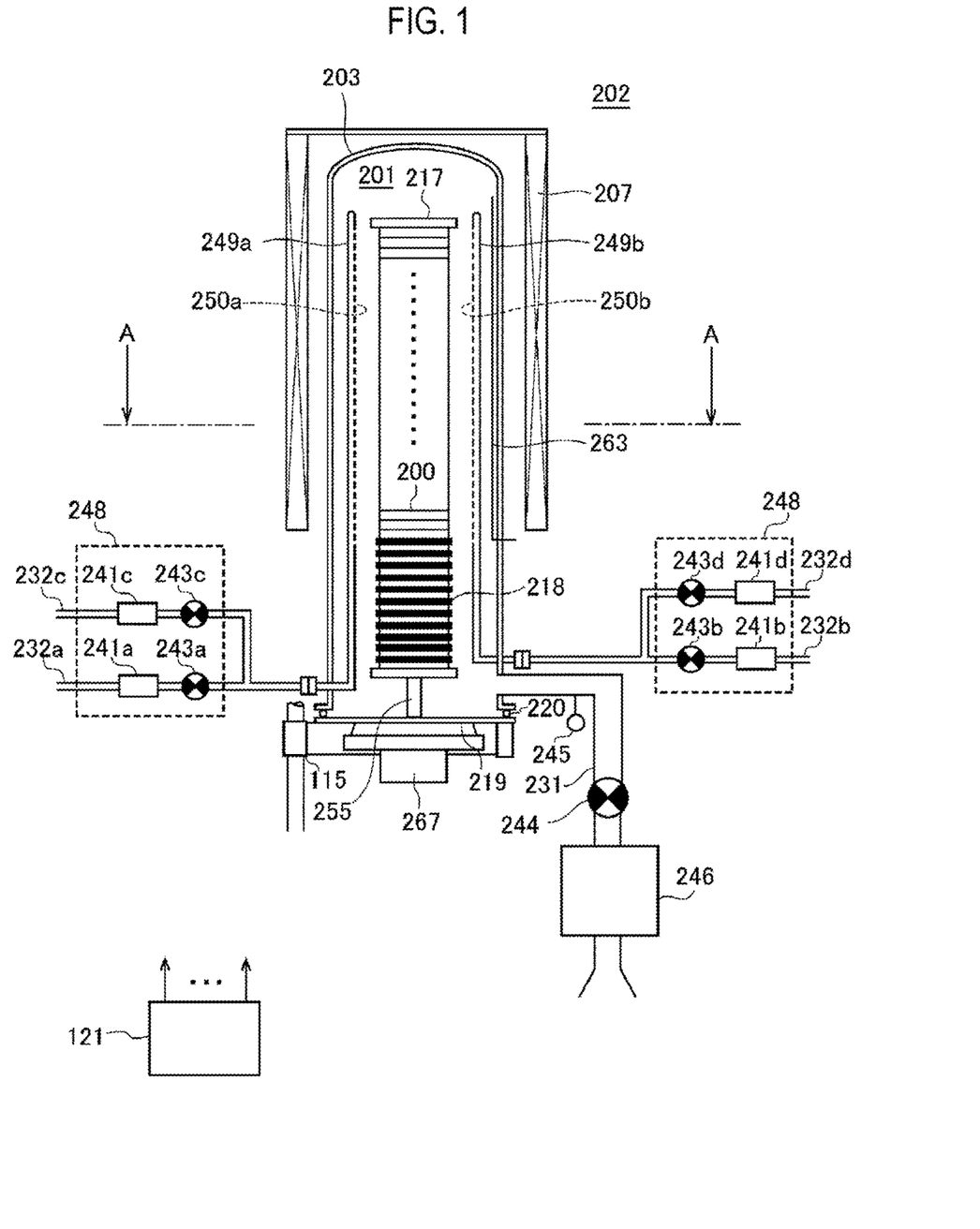
FIG. 1 is a schematic configuration diagram of a vertical type processing furnace of a substrate processing apparatus suitably used in one embodiment of the present disclosure, in which a portion of the processing furnace is shown in a vertical cross sectional view.

One embodiment of the present disclosure will now be described with reference to FIGS. 1 to 3.
(1) Configuration of the Substrate Processing Apparatus As illustrated in FIG. 1, a processing furnace 202 includes a heater 207 as a heating means (heating mechanism). The heater 207 has a cylindrical shape and is supported by a support plate so as to be vertically installed. The heater 207 functions as an activation mechanism (an excitation part) configured to thermally activate (excite) a gas.

A reaction tube 203 constituting a reaction vessel (process vessel) is disposed inside the heater 207 to be concentric with the heater 207. The reaction tube 203 is made of a heat resistant material such as, for example, quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate wafers 200 as substrates.

Nozzles 249a and 249b are installed in the process chamber 201 so as to penetrate a lower sidewall of the reaction tube 203. Gas supply pipes 232a and 232b are respectively connected to the nozzles 249a and 249b.

Mass flow controllers (MFCs) 241a and 241b, which are flow rate controllers (flow rate control parts), and valves 243a and 243b, which are opening/closing valves, are installed in the gas supply pipes 232a and 232b sequentially from the corresponding upstream sides of the gas flow, respectively. Gas supply pipes 232c and 232d, which supply an inert gas, are respectively connected to the gas supply pipes 232a and 232b at the downstream sides of the valves 243a and 243b. MFCs 241c and 241d and valves 243c and 243d are respectively installed in the gas supply pipes 232c and 232d sequentially from the corresponding upstream sides of the gas flow.

Figure 2:
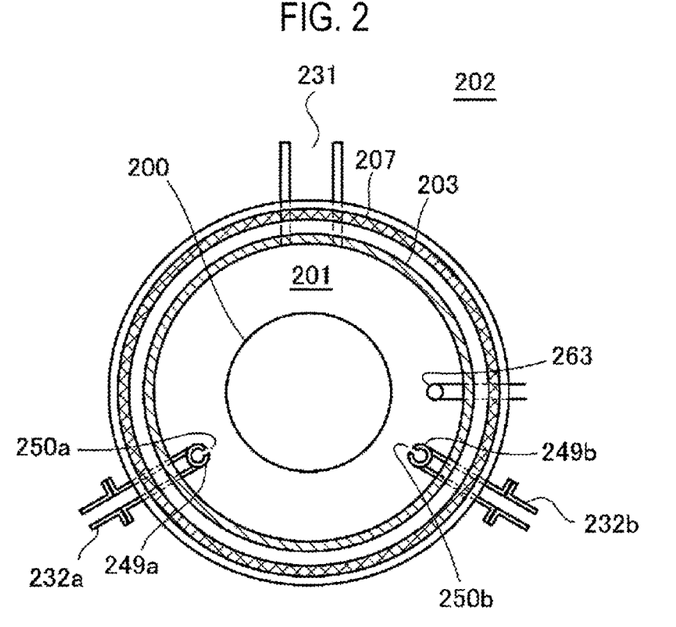
FIG. 2 is a schematic configuration diagram of the vertical type processing furnace of the substrate processing apparatus suitably used in one embodiment of the present disclosure, in which a portion of the processing furnace is shown in a cross sectional view taken along line A-A in FIG. 1.

As illustrated in FIG. 2, the nozzles 249a and 249b are disposed in a space having an annular shape when viewed at a plane between the inner wall of the reaction tube 203 and the wafers 200 such that the nozzles 249a and 249b extend upward along an arrangement direction of the wafers 200 from a lower portion of the inner wall of the reaction tube 203 to an upper portion of the inner wall of the reaction tube 203. Specifically, the nozzles 249a and 249b are installed in a region horizontally surrounding a wafer arrangement region in which the wafers are arrange at a lateral side of the wafer arrangement region, along the wafer arrangement region. Gas supply holes 250a and 250b for supplying a gas are formed on the side surfaces of the nozzles 249a and 249b, respectively. The gas supply holes 250a and 250b are opened toward the center of the reaction tube 203 to allow a gas to be supplied toward the wafers 200. The gas supply holes 250a and 250b may be formed in a plural number between the lower portion of the reaction tube 203 and the upper portion of the reaction tube 203.

A first precursor, for example, a gas (first precursor gas) which satisfies an octet rule (8-electron rule) and has a predetermined pyrolysis temperature (first pyrolysis temperature), is supplied from the gas supply pipe 232a into the process chamber 201 via the MFC 241a, the valve 243a and the nozzle 249a. The precursor gas refers to a gaseous precursor, for example, a gas obtained by vaporizing a precursor which remains in a liquid state under room temperature and atmospheric pressure, or a precursor of a gaseous state under room temperature and atmospheric pressure. As the first precursor gas, it may be possible to use, for example, a disilane ($Si_2H_6$, abbreviation: DS) gas containing silicon (Si) which is an element of group 14. The DS gas is a gas composed of only Si and hydrogen (H). The pyrolysis temperature of the DS gas varies depending on the pressure condition of the interior of the process chamber 201 or the like, and exceeds 400 degrees C. under the pressure condition of a film forming step which will be described later. Furthermore, under this pressure condition, when the internal temperature of the process chamber 201 reaches a temperature which falls within a range of, for example, 440 to 460 degrees C., the pyrolysis of the DS gas starts. The DS gas is hardly or never pyrolyzed by itself under the processing condition of the film forming step which will be described later, but is decomposed by reacting with a second precursor (TEB) which will be described later to thereby act as an Si source.

A second precursor, for example, a gas (second precursor gas) which does not satisfy the octet rule and has a predetermined pyrolysis temperature (second pyrolysis temperature) lower than the first pyrolysis temperature mentioned above, is supplied from the gas supply pipe 232b into the process chamber 201 via the MFC 241b, the valve 243b and the nozzle 249b. As the second precursor gas, it may be possible to use, for example, a triethylborane ($B(C_2H_5)_3$, abbreviation: TEB) gas containing boron (B) which is an element of group 13. The TEB gas is a gas composed of only B, carbon (C) and H. The pyrolysis temperature of the TEB gas varies depending on the pressure condition of the interior of the process chamber 201 or the like, and exceeds 325 degrees C. under the pressure condition of the film forming step which will be described later. Furthermore, under this pressure condition, when the internal temperature of the process chamber 201 reaches a temperature which falls within a range of, for example, 340 to 360 degrees C., the pyrolysis of the TEB gas starts. The TEB gas is hardly pyrolyzed by itself under the processing condition of the film forming step which will be described later, and although pyrolyzed, its behavior is very gentle. The TEB gas is decomposed by reacting with the first precursor (DS) mentioned above to thereby act as a B source or a C source.

Here, the octet rule refers to the rule of thumb that a compound or an ion stably exists when the number of outermost electrons of an atom is eight, namely the rule of thumb that the reactivity of the compound or the ion becomes stable by having a closed-shell configuration.

Since a gas satisfying the octet rule, such as the DS gas, is stable, when the gas is supplied into the process chamber 201, adsorbability of the gas to the surface of the wafer 200 tends to be weakened, namely as it becomes difficult for the gas to be adsorbed on the surface of the wafer 200. Furthermore, as mentioned above, since the pyrolysis temperature of the DS gas is higher than that of the TEB gas, it becomes more difficult for the DS gas to be pyrolyzed than the TEB gas. Due to these characteristics, the consumption (adsorption or decomposition) of the DS gas at the top of a trench (recess) formed on the surface of the wafer 200 is more appropriately suppressed than that of the TEB gas, which makes it easy to reach the bottom of the trench. It can be said that the DS gas has characteristics that are more likely to improve the in-plane film thickness uniformity and step coverage of a film formed on the wafer 200 than the TEB gas.

On the other hand, since a gas not satisfying the octet rule, such as the TEB gas, has a strong reaction force to satisfy the octet rule to thereby be unstable, the gas tends to have strong adsorbability to the surface of the wafer 200 when it is supplied into the process chamber 201, namely the gas tends to be easily adsorbed on the surface of the wafer 200. In addition, as mentioned above, since the pyrolysis temperature of the TEB gas is lower than that of the DS gas, the TEB gas tends to be more easily pyrolyzed than the DS gas. Due to these characteristics, the TEB gas is more easily consumed at the top of the trench formed on the surface of the wafer 200 than the DS gas, and it thus becomes more difficult for the TEB gas to reach the bottom of the trench. It can be said that the TEB gas has characteristics that are likely to lower the in-plane film thickness uniformity and step coverage of the film formed on the wafer 200 than the DS gas.

An inert gas, for example, a nitrogen ($N_2$) gas is supplied from the gas supply pipes 232c and 232d into the process chamber 201 via the respective MFCs 241c and 241d, the respective valves 243c and 243d, the respective gas supply pipes 232a and 232b, and the respective nozzles 249a and 249b.

A first precursor supply system is mainly configured by the gas supply pipe 232a, the MFC 241a, and the valve 243a. A second precursor supply system is mainly configured by the gas supply pipe 232b, the MFC 241b, and the valve 243b. An inert gas supply system is mainly configured by the gas supply pipes 232c and 232d, the MFCs 241c and 241d, and the valves 243c and 243d.

Any or all of the various kinds of supply systems as mentioned above may be configured as an integrated supply system 248 in which the valves 243a to 243d, the MFCs 241a to 241d, and the like are integrated. The integrated supply system 248 is connected to each of the gas supply pipes 232a to 232d, and is configured such that the supply operation of various kinds of gases into the gas supply pipes 232a to 232d, namely the opening/closing operations of the valves 243a to 243d, the flow rate regulation operation by the MFCs 241a to 241d, and the like are controlled by a controller 121 which will be described later. The integrated supply system 248 is configured as an integrated unit of an integral type or a division type, and can be detachable from the gas supply pipes 232a to 232d, and the like on an integrated unit basis, which makes it possible to perform the maintenance, replacement, expansion and the like of the supply system on an integrated unit basis.

An exhaust pipe 231 configured to exhaust the internal atmosphere of the process chamber 201 is installed in the reaction tube 203. A vacuum pump 246 as an exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). It is configured to open or close the APC valve 244 to vacuum exhaust or to stop the vacuum exhaust of the interior of the process chamber 201 while operating the vacuum pump 246 and to adjust the opening degree of the APC valve 243 based on the pressure information detected by the pressure sensor 245 to adjust the internal pressure of the process chamber 201 while operating the vacuum pump 246. An exhaust system is mainly configured by the exhaust pipe 231, the APC valve 244 and the pressure sensor 245. Consideration may be given to include the vacuum pump 246 in the exhaust system.

A seal cap 219, which serves as a furnace opening lid configured to air-tightly seal a lower end opening of the reaction tube 203, is installed under the reaction tube 203. The seal cap 219 is made of metal such as, for example, stainless steel (SUS) or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which transfers the wafers 200 into and out of the process chamber 201 by moving the seal cap 219 up and down.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as, for example, quartz or SiC. Heat insulating plates 218 made of a heat resistant material such as, for example, quartz, SiC or the like are supported at a lower portion of the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
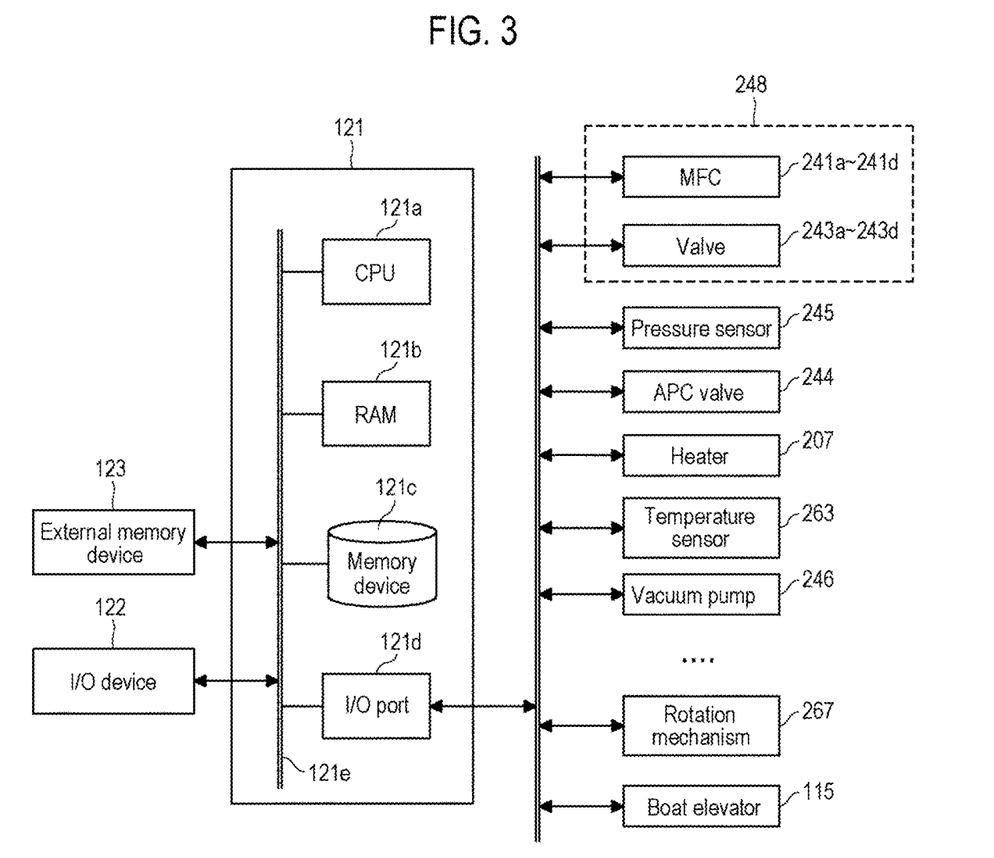
FIG. 3 is a schematic configuration diagram of a controller of the substrate processing apparatus suitably used in one embodiment of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 formed of, for example, a touch panel or the like, is connected to the controller 121.

The memory device 121c is configured by, for example, a flash memory, a hard disk drive (HDD), or the like. A control program for controlling operations of a substrate processing apparatus, a process recipe for specifying sequences and conditions of substrate processing as described later, or the like is readably stored in the memory device 121c. The process recipe functions as a program for causing the controller 121 to execute each sequence in a substrate processing process, as described later, to obtain a predetermined result. Hereinafter, the process recipe and the control program will be generally and simply referred to as a "program". Furthermore, the process recipe will be simply referred to as a "recipe". When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115 and the like, as mentioned above.

The CPU 121a is configured to read the control program from the memory device 121c and execute the same. The CPU 121a also reads the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operations of rotating the boat 217 and adjusting the rotation speed of the boat 217 by the rotation mechanism 267, the operation of moving the boat 217 up and down by the boat elevator 115, and the like.

The controller 121 may be configured by installing, on the computer, the aforementioned program stored in an external memory device 123 (e.g., a magnetic tape, a magnetic disk such as a hard disk, an optical disc such as a CD, a magneto-optical disc such as an MO, a semiconductor memory such as a USB memory). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using communication means such as the Internet or a dedicated line, instead of using the external memory device 123.

(2) Substrate Processing Process

A sequence example of forming a film containing Si, B and C, that is, a silicon boron carbide film (SiBC film), on a wafer 200 as a substrate using the aforementioned substrate processing apparatus, which is one of the processes for manufacturing a semiconductor device, will be described with reference to FIG. 4A. Furthermore, the SiBC film is a film containing Si as a major element (predetermined element). In the following descriptions, the operations of the respective parts constituting the substrate processing apparatus are controlled by the controller 121.

Figure 4A:
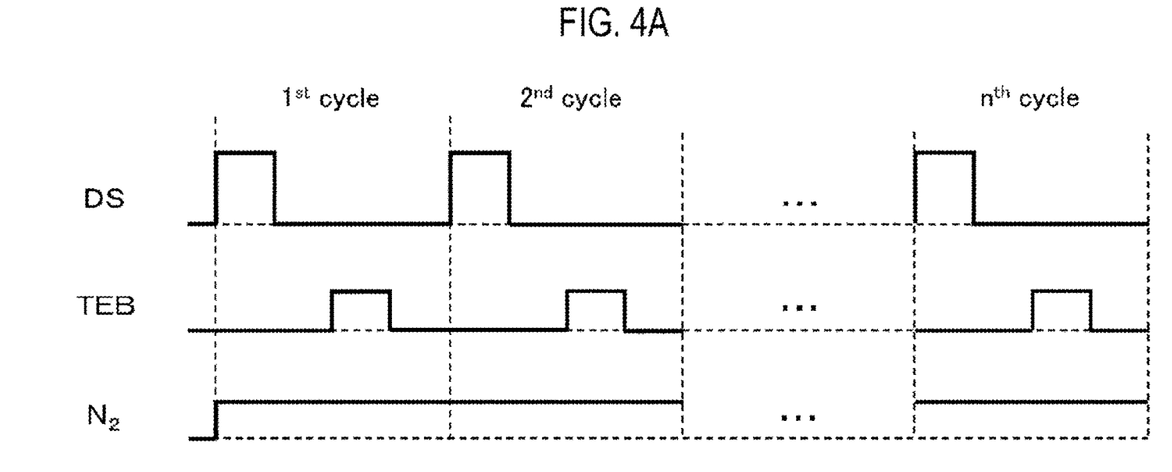
FIG. 4A is a diagram illustrating a film forming sequence according to one embodiment of the present disclosure and FIG. 4B is a diagram illustrating an exemplary modification thereof.

In the film forming sequence illustrated in FIG. 4A, an SiBC film is formed on the wafer 200 by causing a DS gas and a TEB gas to intermittently react with each other by repeating a cycle a plurality of times (n times), the cycle alternately performing: step 1 of supplying the DS gas to the wafer 200 and step 2 of supplying the TEB gas to the wafer 200. In the film forming process, the supply amount of the DS gas to the wafer 200 is set to be greater than that of the TEB gas to the wafer 200. In the present disclosure, for the sake of convenience, the film forming sequence illustrated in FIG. 4A may sometimes be denoted as follows. The same denotation will be used in the modifications as described later.

(DS→TEB)×n⇒SiBC

When the term "wafer" is used herein, it may refer to "a wafer itself" or "a laminated body of a wafer and a predetermined layer or film formed on the surface of the wafer". In addition, when the phrase "a surface of a wafer" is used herein, it may refer to "a surface of a wafer itself" or "a surface of a predetermined layer formed on a wafer". Furthermore, in the present disclosure, the expression "a predetermined layer is formed on a wafer" may mean that "a predetermined layer is directly formed on a surface of a wafer itself" or that "a predetermined layer is formed on a layer formed on a wafer". In addition, when the term "substrate" is used herein, it may be synonymous with the term "wafer".

(Wafer Charging and Boat Loading)

A plurality of wafers 200 is charged on the boat 217 (wafer charging). As the wafer 200, it may be possible to use, for example, a Si substrate formed of a single crystal Si and having a recess such as a trench on its surface. For example, an insulating film such as a silicon oxide film (SiO film), a silicon nitride film (SiN film), a silicon oxynitride film (SiON film) or the like may be formed on a portion of the surface of the wafer 200. Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 through the O-ring 220.

(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. Furthermore, the interior of the process chamber 201 is heated by the heater 207 such that the wafers 200 in the process chamber 201 reach a desired film-forming temperature. In this operation, the state of supplying electric power to the heater 207 is feedback-controlled based on the temperature information detected by the temperature sensor 263 such that the interior of the process chamber 201 has a desired temperature distribution. Further, the rotation of the wafers 200 by the rotation mechanism 267 begins. The exhaust and heating of the interior of the process chamber 201 and the rotation of the wafer 200 may be continuously performed at least until the processing of the wafers 200 is completed.

(Film Forming Step)

Next, the following steps 1 and 2 are sequentially performed to bury an SiBC film into a trench formed on the surface of the wafer 200.

[Step 1]

At this step, a DS gas is supplied to the wafer 200. Specifically, the valve 243a is opened to allow a DS gas to flow through the gas supply pipe 232a. The flow rate of the DS gas is adjusted by the MFC 241a. The DS gas is supplied into the process chamber 201 via the nozzle 249a and is exhausted from the exhaust pipe 231. At this time, the DS gas is supplied to the wafer 200. Simultaneously, the valve 243c is opened to allow an $N_2$ gas to flow through the gas supply pipe 232c. The $N_2$ gas is supplied into the process chamber 201 together with the DS gas and is exhausted from the exhaust pipe 231. Furthermore, in order to prevent the DS gas from entering the nozzle 249b, the valve 243d is opened to allow the $N_2$ gas to flow through the gas supply pipe 232d. The $N_2$ gas is supplied into the process chamber 201 via the gas supply pipe 232b and the nozzle 249b and is exhausted from the exhaust pipe 231.

By supplying the DS gas to the wafer 200, DS is physisorbed or chemisorbed onto the surface of the wafer 200, and an adsorption layer (DS adsorption layer) of DS molecules is formed on the wafer 200. Under the processing conditions of this step which will be described later, the DS gas supplied into the process chamber 201 is hardly or never pyrolyzed by itself. Therefore, the DS gas is not excessively consumed at the top of the trench and reaches the bottom of the trench. The DS adsorption layer formed on the wafer 200 becomes a continuous layer having a uniform thickness and having high step coverage over the entire in-plane region of the wafer 200, for example, from the top to the bottom of the trench.

When the formation of the DS adsorption layer is completed, the valve 243a is closed to stop the supply of the DS gas. At this time, the interior of the process chamber 201 is vacuum-exhausted by the vacuum pump 246 while opening the APC valve 244. Thus, the unreacted gas or the gas contributed to the aforementioned reaction, which remains within the process chamber 201, is removed from the interior of the process chamber 201. At this time, the supply of the $N_2$ gas into the process chamber 201 is maintained while opening the valves 243c and 243d. The $N_2$ gas acts as a purge gas.

[Step 2]

After step 1 is completed, a TEB gas is supplied to the wafer 200. At this step, the opening/closing control of the valves 243b, 243c and 243d is performed at the same time as the opening/closing control of the valves 243a, 243c and 243d at step 1 to allow the TEB gas to flow through the gas supply pipe 232b. The flow rate of the TEB gas flowing through the gas supply pipe 232b is adjusted by the MFC 241b. The TEB gas is supplied into the process chamber 201 via the nozzle 249b and is exhausted from the exhaust pipe 231. At this time, the TEB gas is supplied to the wafer 200.

By supplying the TEB gas to the wafer 200, the DS adsorption layer formed on the wafer 200 and TEB may react to be decomposed. Thus, Si contained in the DS adsorption layer and B and C contained in TEB may be bonded. As a result, the DS adsorption layer formed on the wafer 200 may be modified to a layer containing Si, B, and C, that is, an SiBC layer. The SiBC layer is a layer containing a Si—B bond, a Si—C bond, and a Si—Si bond. Under the processing conditions of this step which will be described later, the pyrolysis of the TEB gas supplied into the process chamber 201 alone is appropriately suppressed. Furthermore, depending on the processing conditions, the TEB gas supplied into the process chamber 201 is hardly or never pyrolyed by itself. Under such processing conditions, the TEB gas is not excessively consumed at the top of the trench so that the TEB gas can reach the bottom of the trench. Moreover, as mentioned above, the DS adsorption layer formed at step 1 has a uniform thickness from the top of the trench to the bottom of the trench. Thus, the SiBC layer formed on the wafer 200 becomes a continuous layer having a uniform thickness and uniform composition and having high step coverage over the entire in-plane region of the wafer 200, for example, from the top of the trench to the bottom of the trench.

When the formation of the SiBC layer is completed, the valve 243b is closed to stop the supply of the TEB gas. Then, the unreacted gas, the gas contributed to the aforementioned reaction, or the reaction byproduct, which remains within the process chamber 201, is removed from the interior of the process chamber 201 according to the same processing procedures as those of step 1.

(Performing a Predetermined Number of Times)

A cycle which alternately, that is, non-synchronously and non-simultaneously, performs steps 1 and 2 described above is implemented multiple times (n times) (where n is an integer of 2 or more). Thus, an SiBC film having a predetermined film thickness and a predetermined composition can be formed on the wafer 200 by causing DS and TEB to intermittently reach each other on the surface of the wafer 200. It is desirable that the aforementioned cycle be repeated multiple times. That is, it is desirable that the thickness of the SiBC layer formed per one cycle be set smaller than a desired film thickness and the aforementioned cycle be repeated multiple times until the thickness of the film formed by laminating the SiBC layer becomes equal to the desired thickness.

Next, the processing conditions of the film forming step will be described in detail.

The supply flow rate of the DS gas at step 1 may be set at a predetermined flow rate which falls within a range of, for example, 1 to 2,000 sccm. The supply time of the DS gas may be set at a predetermined time which falls within a range of, for example, 1 to 120 seconds, specifically 1 to 60 seconds. The supply flow rate of the TEB gas at step 2 may be set at a predetermined flow rate which falls within a range of, for example, 1 to 1,000 sccm. The supply time of the TEB gas may be set at a predetermined time which falls within a range of, for example, 1 to 120 seconds, specifically 1 to 60 seconds. At steps 1 and 2, the supply flow rate of the $N_2$ gas supplied from each gas supply pipe may be set at a predetermined flow rate which falls within a range of, for example, 0 to 10,000 sccm. By not supplying the $N_2$ gas, it becomes possible to increase the partial pressure of each of the precursor gases to thereby improve the quality of a layer.

However, at steps 1 and 2, each of the precursor gases is supplied under a condition in which the ratio of the supply amount of the TEB gas to the supply amount of the DS gas (TEB/DS supply ratio) is, for example, 0.1 or more and less than 1, namely under a condition in which the supply amount of the DS gas to the wafer 200 is more than the supply amount of the TEB gas to the wafer 200. Furthermore, it is desirable that the TEB/DS supply ratio be set to be, for example, 0.1 or more and 0.5 or less, specifically 0.1 or more 0.2 or less, more specifically 0.1 or more and 0.17 or less.

If the TEB/DS supply ratio is 1 or more, there may be a case where the step coverage of the SiBC film formed on the wafer 200 is insufficient. This problem may be solved by setting the TEB/DS supply ratio to less than 1. By setting the TEB/DS supply ratio to 0.5 or less, it is possible to increase the step coverage of the SiBC film. By setting the TEB/DS supply ratio to 0.2 or less, it is possible to further increase the step coverage of the SiBC film. By setting the TEB/DS supply ratio to 0.17 or less, it is possible to even further increase the step coverage of the SiBC film. Furthermore, as will be described later, it is possible to increase sharply the effect of enhancing the step coverage of the SiBC film by setting the TEB/DS supply ratio to 0.2 or less.

If the TEB/DS supply ratio is less than 0.1, the content of B and C in the film formed on the wafer 200 may be insufficient and it is thus difficult for this film to have a desired composition. In addition, there may be a case where the deposition rate is reduced, thereby lowering the productivity of the film forming process. By setting the TEB/DS supply ratio to 0.1 or more, the content of B and C in the film formed on the wafer 200 may be increased so that this film may have a desired composition. It is also possible to enhance the productivity of the film forming process by increasing the deposition rate.

In order to realize the aforementioned TEB/DS supply ratio, it may be effective to set the supply time of the DS gas at step 1 longer than that of the TEB gas at step 2, to set the supply flow rate of the DS gas at step 1 greater than that of the TEB gas at step 2, or to set the partial pressure of the DS gas within the process chamber 201 at step 1 greater than that of the TEB gas within the process chamber 201 at step 2. These methods may be arbitrarily combined. These methods may also be switched according to the progress of the film forming step.

The temperature of the wafer 200 (film-forming temperature) may be set to fall within a range of, for example, 250 to 400 degrees C., specifically 250 to 350 degrees C., more specifically 250 to 325 degrees C. The internal pressure (film-forming pressure) of the process chamber 201 may be set to fall within a range of, for example, 10 to 1,000 Pa, specifically 20 to 200 Pa.

If the film-forming temperature is lower than 250 degrees C. or the film-forming pressure is lower than 10 Pa, there may be a case where it becomes difficult for the aforementioned film forming process to proceed. By setting the film-forming temperature to become higher than 250 degrees C. or by setting the film-forming pressure to become higher than 10 Pa, it becomes possible to allow the aforementioned film forming process to go ahead at a practical deposition rate. By setting the film-forming pressure to become higher than 20 Pa, it is possible to further increase the deposition rate to thereby further increase the productivity of the film forming process.

If the film-forming temperature exceeds 400 degrees C. or the film-forming pressure exceeds 1,000 Pa, there may be case where the behavior of decomposition of the DS gas and the TEB gas becomes severe and the step coverage of the SiBC film deteriorates. By setting the film-forming temperature to be 400 degrees C. or less or by setting the film-forming pressure to be 1,000 Pa or less, it is possible to avoid the pyrolysis of the DS gas and to relax the behavior of pyrolysis of the TEB gas, thereby improving the step coverage of the SiBC film. By setting the film-forming temperature to be 350 degrees C. or less or by setting the film-forming pressure to be 200 Pa or less, it is possible to more reliably avoid the pyrolysis of the DS gas and to further suppress the pyrolysis of the TEB gas, thereby further improving the step coverage of the SiBC film. By setting the film-forming temperature to be equal to or less than 325 degrees C., these effects can be more reliably achieved, thereby further improving the step coverage of the SiBC film.

In addition, the aforementioned film-forming temperature (a temperature ranging from 250 to 400 degrees C.) is a temperature lower than the pyrolysis temperature (first pyrolysis temperature) of the DS gas, and is also a temperature at which the DS gas is not pyrolyzed if the DS gas exists alone within the process chamber 201. Furthermore, the temperature which falls within the range of 250 to 325 degrees C., among the film-forming temperatures shown herein, is a temperature lower than the pyrolysis temperature (second pyrolysis temperature) of the TEB gas and is also a temperature at which the TEB gas is not pyrolyzed if the TEB gas exists alone within the process chamber 201.

The aforementioned film forming process can be performed at a practical deposition rate even under such a low temperature condition because of the TEB gas acting as a catalyst. In this process, the TEB gas acts to promote the film forming process by increasing the decomposition rate of DS adsorbed on the surface of the wafer 200. In addition, the TEB gas acts as a catalyst due to the polarity of the TEB molecules. Here, the polarity refers to an electrical bias present in molecules (or chemical bonds). A state in which the polarity is present refers to, for example, a state in which a distribution of positive and negative charges are uneven within molecules, in such a way that an electric charge is positive on one side and negative on the other side in distribution within the molecules, namely a state in which the center of gravity of positive charges and the center of gravity of negative charges within the molecules do not match. By using the TEB gas having a polarity equal to or higher than that of the first precursor (DS gas) as the second precursor, this gas may act as a catalyst, which makes it possible to perform the aforementioned film forming process at a practical deposition rate. Furthermore, the TEB gas in the present embodiment may react with the DS gas to be decomposed so that the TEB gas itself may be changed before and after the reaction. Thus, in the reaction system of the present embodiment, the TEB gas acts as a catalyst, and strictly speaking, the TEB gas may be regarded as a quasi-catalyst different from a catalyst.

As the first precursor, it may be possible to use, other than the DS gas, a gas expressed by a general formula $Si_nH_{2n-2}$ (where n is an integer of 1 or more), such as a monosilane ($SiH_4$, abbreviation: MS) gas, a trisilane ($Si_3H_8$) gas, a tetrasilane ($Si_4H_{10}$) gas or the like, that is, a silicon hydride gas. Furthermore, as the first precursor, it may be possible to use an alkylsilane-based gas, such as a monomethylsilane ($SiH_3CH_3$, abbreviation: MMS) gas, a dimethylsilane ($SiH_2(CH_3)_2$, abbreviation: DMS) gas, a monoethylsilane ($SiH_3C_2H_5$, abbreviation: MES) gas, a vinylsilane ($SiH_3C_2H_3$, abbreviation: VS) gas, a monomethyldisilane ($SiH_3SiH_2CH_3$, abbreviation: MMDS) gas, a hexamethyldisilane (($CH_3)_3$—Si—Si—$(CH_3)_3$, abbreviation: HMDS) gas, a 1,4-disilabutane ($SiH_3CH_2CH_2SiH_3$, abbreviation: 1,4-DSB) gas, a 1,3-disilabutane ($SiH_3CH_2SiH_2CH_3$, abbreviation: 1,3-DSB) gas, a 1,3,5-trisilapentane ($SiH_3CH_2SiH_2CH_2SiH_3$, abbreviation: 1,3,5-TSP) gas or the like, that is, a gas composed of only Si, C and H. In addition, as the first precursor, it may be possible to use an aminosilane-based gas such as a bis-tertiary-butyl-aminosilane ($SiH_2[NH(C_4H_9)]_2$, abbreviation: BTBAS) gas, a tris-dimethylaminosilane ($SiH[N(CH_3)_2]_3$, abbreviation: 3DMAS) gas, a trisilylamine (($SiH_3)_3N$, abbreviation: TSA) gas or the like. Moreover, in the case of using a gas containing N, such as an aminosilane-based gas, as the first precursor, N can be added to the film formed on the wafer 200, which makes it possible to use this film possible as an SiBCN film.

As the second precursor, it may be possible to use, other than the TEB gas, a gas expressed by a general formula $BR_3$ (where R is an alkyl group), such as a trimethylborane ($B(CH_3)_3$, abbreviation: TMB) gas, a tripropylborane ($B(C_3H_7)_3$, abbreviation: TPB) gas, a tributylborane ($B(C_4H_9)_3$, Abbreviation: TBB) gas or the like, that is, an alkylborane-based gas. Furthermore, as the second precursor, it may be possible to use a haloborane-based gas such as a trifluoroborane ($BF_3$) gas, a trichloroborane ($BCl_3$) gas, a tribromoborane ($BBr_3$) gas, a triiodoborane ($BI_3$) gas or the like. In addition, as the second precursor, it may be possible to use a gas expressed by a chemical formula $B(NR_2)_3$, such as a tris-dimethylaminoborane ($B(N(CH_3)_2)_3$, abbreviation: TDMAB) gas, a tris-diethylaminoborane ($B(N(C_2H_5)_2)_3$, abbreviation: TDEAB) gas, a tris-dipropylaminoborane ($B(N(C_3H_7)_2)_3$, abbreviation: TDPAB) gas, a tris-dibutylaminoborane ($B(N(C_4H_9)_2)_3$, abbreviation: TDBAB) gas or the like, that is, an aminoborane-based gas. Also as the second precursor, it may be possible to use a gas expressed by a chemical formula $B(OR)_3$, such as a trimethyl borate ($B(OCH_3)_3$, abbreviation: TMOB) gas, a triethyl borate ($B(OC_2H_5)_3$, abbreviation: TEOB) gas, a tripropyl borate ($B(OC_3H_7)_3$, abbreviation: TPOB) gas, a tributyl borate ($B(OC_4H_9)_3$, abbreviation: TBOB) gas or the like, that is, an alkoxyborane-based gas. Moreover, in the case of using a gas containing N, such as an aminoborane-based gas, as the second precursor, N can be added to the film formed on the wafer 200, and this film can be used as an SiBCN film. In addition, in the case of using a gas containing O, such as an alkoxyborane-based gas, as the second precursor gas, O can be added to the film formed on the wafer 200, and this film can be used as an SiBOC film.

When a precursor gas with a low polarity is supplied into the process chamber 201, its adsorption to the top of the trench formed on the surface of the wafer 200 is moderately suppressed, so that it is likely to reach the bottom of the trench. Thus, it can be said that the precursor gas with low polarity has a characteristic that is easier to enhance the step coverage of the film formed on the wafer 200 than the precursor gas with high polarity. On the other hand, when the precursor gas with high polarity is supplied into the process chamber 201, it is excessively adsorbed on the top of the trench formed on the surface of the wafer 200, so that it is difficult to reach the bottom of the trench. Thus, it can be said that a precursor gas with high polarity has a characteristic that is easier to lower the step coverage of the film formed on the wafer 200 than a precursor gas with low polarity.

As described above, a gas with low polarity has characteristics similar to those of the aforementioned gas satisfying the octet rule, at least regarding the step coverage of the film formed on the wafer 200. Furthermore, a gas with high polarity has characteristics similar to those of the aforementioned gas not satisfying the octet rule, at least regarding the step coverage of the film formed on the wafer.

As the inert gas, it may be possible to use, other than the $N_2$ gas, for example, a rare gas such as an Ar gas, a He gas, a Ne gas, a Xe gas or the like.

(After Purge and Atmospheric Pressure Restoration)

After the formation of the SiBC film is completed, the $N_2$ gas is supplied from each of the gas supply pipes 232c and 232d into the process chamber 201 and is exhausted from the exhaust pipe 231. The $N_2$ gas acts as a purge gas. Thus, the interior of the process chamber 201 is purged with an inert gas, and the gas or the reaction byproduct, which remains within the process chamber 201, is removed from the interior of the process chamber 201 (after purge). Thereafter, the internal atmosphere of the process chamber 201 is substituted by the inert gas (inert gas substitution). The internal pressure of the process chamber 201 is returned to atmospheric pressure (atmospheric pressure restoration).

(Boat Unloading and Wafer Discharging)

The seal cap 219 is moved down by the boat elevator 115 to open the lower end of the reaction tube 203. The processed wafers 200 supported on the boat 217 are unloaded from the lower end of the reaction tube 203 and moved outside of the reaction tube 203 (boat unloading). The processed wafers 200 are discharged from the boat 217 (wafer discharging).

(3) Effects According to the Present Embodiment

According to the present embodiment, one or more effects as set forth below may be achieved.

(a) As mentioned above, the DS gas satisfying the octet rule has characteristics that are more stable than the TEB gas not satisfying the octet rule and is not easily adsorbed on the surface of the wafer 200. Furthermore, the DS gas has characteristics that make it more difficult to be pyrolyzed than the TEB gas. Due to these characteristics, when the DS gas supplied to the surface of the wafer 200, it is more likely to reach the bottom of the trench than the TEB gas, thereby easily enhancing the in-plane film thickness uniformity and step coverage of the film formed on the wafer 200. As in the present embodiment, by setting the supply amount of the DS gas at the film forming step to be more than the supply amount of the TEB gas at the film forming step (the supply amount of the DS gas>the supply amount of the TEB gas), it is possible to enhance the film thickness uniformity and step coverage of the SiBC film formed on the wafer 200.

Figure 5A:
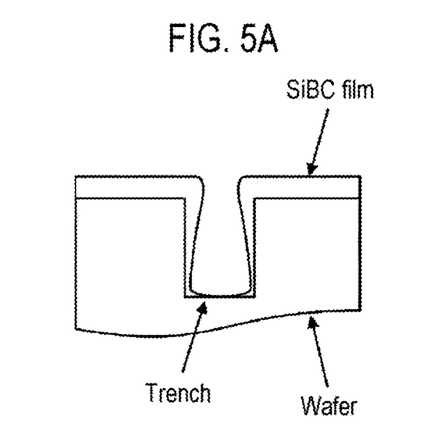
FIGS. 5A and 5B are enlarged cross sectional views of a substrate after performing a film forming process.
Figure 5B:
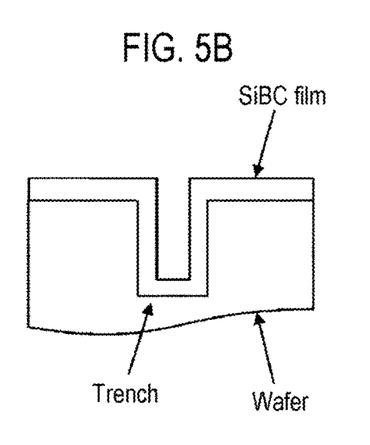

FIG. 5A illustrates a cross-sectional view of an SiBC film formed by alternately supplying the DS gas and the TEB gas under a condition that the supply amount of the DS gas≤the supply amount of the TEB gas with respect to the wafer with a trench formed on its surface. Furthermore, FIG. 5B illustrates a cross-sectional view of an SiBC film formed by alternately supplying the DS gas and the TEB gas under a condition that the supply amount of the DS gas>the supply amount of the TEB gas with respect to the wafer configured in the same manner. As can be seen from a comparison therebetween, when the supply amount of the DS gas≤the supply amount of the TEB gas, it becomes difficult to proceed with the film forming process in the bottom of the trench, so that the in-plane film thickness uniformity and step coverage of the SiBC film may be damaged. By setting the supply amount of the DS gas to be greater than the supply amount of the TEB gas, the film forming process may be performed at an equal rate from the top of the trench to the bottom of the trench, thereby enhancing the in-plane film thickness uniformity and step coverage of the SiBC film. Moreover, by continuously performing the film forming process, it is possible to reliably bury the SiBC film into the trench, without causing a void or the like within the trench.

(b) It is possible to form the SiBC film under a low temperature condition within a range of, for example, 250 to 400 degrees C., specifically 250 to 350 degrees C., more specifically 250 to 325 degrees C. by the catalytic action of the TEB gas. This makes it possible to desirably control the thermal history of the wafer 200. This method is particularly effective in a process (e.g., a middle end) requiring a low temperature in film formation, in a manufacturing process of a semiconductor device.

(c) It is possible to further enhance the in-plane film thickness uniformity and step coverage of the SiBC film formed on the wafer 200 by performing the film forming step under a temperature condition in which the DS gas is not pyrolyzed when the DS gas exists alone within the process chamber 201. This is because, by performing the film forming step under a temperature condition lower than the pyrolysis temperature (e.g., 440 to 460 degrees C.) of the DS gas, for example, a temperature condition of 250 to 400 degrees C., specifically 250 to 350 degrees C., it is possible to prevent the DS gas from being pyrolyzed alone within the process chamber 201 so that the DS gas can reliably reach the bottom of the trench.

(d) By performing the film forming step under a temperature condition in which the TEB gas is not pyrolyzed when the TEB gas exists alone within the process chamber 201, it is possible to further enhance the in-plane film thickness uniformity and step coverage of the SiBC film formed on the wafer 200. This is because, by performing the film forming step under a temperature condition lower than the pyrolysis temperature of the TEB gas (e.g., 340 to 360 degrees C.), for example, a temperature condition of 250 to 325 degrees C., it is possible to prevent the TEB gas from being pyrolyzed alone within the process chamber 201 so that the TEB gas can reliably reach the bottom of the trench.

(e) By adding B or C to the film formed on the wafer 200, it becomes possible to form this film as a film having excellent processing resistance such as etching resistance or the like.

(f) By alternately supplying the DS gas and the TEB gas into the process chamber 201 with purging therebetween, it is possible to cause these gases to appropriately react with each other under a condition in which a surface reaction is dominant and to enhance the controllability of film thickness. Furthermore, it is possible to suppress generation of particles within the process chamber 201, thereby improving the quality of film forming process.

(g) The effects mentioned above can be similarly achieved in the case where a silane-based gas other than the DS gas is used as the first precursor or in the case where a borane-based gas other than the TEB gas is used as the second precursor.

(4) Modifications

The film forming sequence of the present embodiment is not limited to the aspects described above but may be modified as in the modifications described below.

(Modification 1)

Figure 4B:
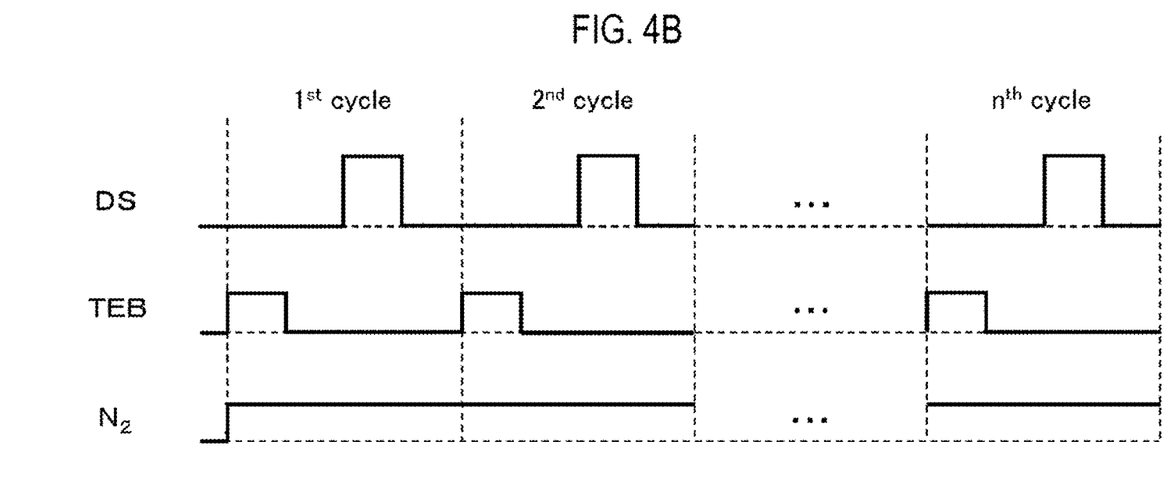

As in the film forming sequence illustrated in FIG. 4B or shown below, a cycle which sequentially and alternately performs a step of supplying a TEB gas to a wafer 200 and a step of supplying a DS gas to the wafer 200 may be repeated a plurality of times (n times). That is, the order of supplying the TEB gas and the DS gas may be changeable. The processing conditions and processing procedures at each step are the same as those of the film forming sequence illustrated in FIG. 4A, except for the order of supplying the gases. That is, when the film forming process is performed, the supply amount of the DS gas to the wafer 200 may be set to be larger than that of the TEB gas with respect to the wafer 200.

(TEB→DS)×n⇒SiBC

Even in this modification, the same effects as those of the film formation sequence illustrated in FIG. 4A may be achieved. Furthermore, this modification in which the supply of the TEB gas having relatively high adsorbability is performed earlier (initially) than that of the DS gas having a relatively low adsorbability is advantageous in that the film forming process may be performed more effectively at a first cycle than the film formation sequence illustrated in FIG. 4A. Meanwhile, the film forming sequence illustrated in FIG. 4A in which the supply of the DS gas easily reaches the bottom of the trench is performed earlier (initially) than that of the TEB gas that does not easily reach the bottom of the trench is advantageous in that the in-plane film thickness uniformity and step coverage of the film formed on the wafer 200 is more easily enhanced than this modification.
(Modification 2)

As in the film forming sequence shown below, a seed layer may be formed on the wafer 200 in advance by supplying the DS gas to the wafer 200 a predetermined number of times (m times (where m is an integer of 1 or more)) before initiating the formation of the SiBC film. Furthermore, when forming the seed layer, a halosilane gas such as a dichlorosilane ($SiH_2Cl_2$, abbreviation: DCS) gas or the like may be used instead of the DS gas. The seed layer may also be formed by performing a cycle of alternately supplying the DCS gas and the DS gas to the wafer 200 a predetermined number of times (m times).

DS×m→(DS→TEB)×n ⇒ SiBC/seed layer

DCS×m→(DS→TEB)×n ⇒ SiBC/seed layer (DCS→DS)×m→(DS→TEB)×n ⇒ SiBC/seed layer

Even in this modification, the same effects as those of the film forming sequence illustrated in FIG. 4A may be achieved. Furthermore, by forming the seed layer in advance before initiating the formation of the SiBC film, it becomes possible to further improve the in-plane film thickness uniformity and step coverage of the SiBC film. When an insulating film such as an SiO film is formed on a portion of the surface of the wafer 200, it is desirable to use the DCS gas instead of the DS gas or in addition to the DS gas when forming the seed layer. In this case, a predetermined treatment effect (cleaning effect of the underlayer) can be exhibited by the DCS gas, so that it is possible to efficiently form the seed layer. In addition, it becomes easy to form the seed layer as a continuous layer, and as a result, it is possible to further improve the in-plane film thickness uniformity and the step coverage of the SiBC film. Instead of the halosilane gas such as the DCS gas, it may also be possible to use a hydrogen chloride (HCl) gas or a chlorine ($Cl_2$) gas.

Other Embodiments of the Present Disclosure

While one embodiment of the present disclosure has been specifically described above, the present disclosure is not limited to the aforementioned embodiment but may be differently modified without departing from the spirit of the present disclosure.

Process recipes used in substrate processing may be prepared individually according to the contents of substrate processing and may be stored in the memory device 121c via a telecommunication line or the external memory device 123. Moreover, at the start of substrate processing, the CPU 121a may properly select an appropriate recipe from the recipes stored in the memory device 121c according to the contents of substrate processing. With this configuration, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, for example, a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace.

In the case of using these substrate processing apparatuses, a film forming process may be performed by the processing sequences and processing conditions similar to those of the embodiment and modifications described above. Effects similar to those of the embodiment and modifications described above may be achieved.

It may be possible to suitably use the SiBC film formed by the method of the aforementioned embodiment as a hard mask or an etch stopper layer or as a buried layer of middle end of line (MEOL).

The embodiment and modifications described above may be appropriately combined with one another. In addition, the processing conditions used at this time may be similar to, for example, those of the aforementioned embodiment.

Examples

Hereinafter, experimental results supporting the effects achieved from the aforementioned embodiment and modifications will be described.
(Pyrolysis Temperature of DS and TEB)

In a first evaluation, a DS gas was supplied alone to a heated wafer using the substrate processing apparatus illustrated in FIG. 1. The temperature of the wafer was set at 400, 425, 450, and 475 degrees C. Other processing conditions were similar to those of the aforementioned embodiment. Furthermore, in a second evaluation, a TEB gas was supplied alone to the heated water using the substrate processing apparatus illustrated in FIG. 1. The temperature of the wafer was set at 325, 350, 375, and 400 degrees C. Other processing conditions were similar to those of the first evaluation.

Figure 6A:
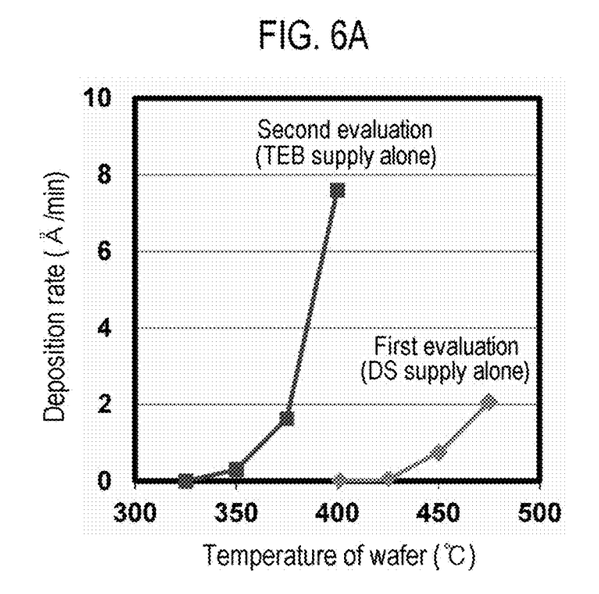
FIG. 6A is a diagram illustrating an evaluation result of pyrolysis characteristics of a precursor gas and FIG. 6B is a diagram illustrating an evaluation result of a relationship between a supply ratio of a precursor gas and step coverage.

Thereafter, a deposition rate of a film deposited on the wafer by pyrolysis of the DS gas or the TEB gas was measured. In FIG. 6A, the horizontal axis represents a temperature of the wafer and the vertical axis represents a deposition rate (□/min) of the film. In the drawing, the mark ♦ indicates a measurement result of the first evaluation and the mark ■ indicates a measurement result of the second evaluation. In FIG. 6A, it indicates that the larger the value on the vertical axis is, the more the precursor is actively pyrolyzed.

In FIG. 6A, in the first evaluation in which the DS gas was supplied alone to the wafer, it can be seen that a film was not deposited on the wafer under a condition of the temperatures of 400 and 425 degrees C. and a film was deposited on the wafer under a condition of the temperatures of 450 and 475 degrees C. Furthermore, in the second evaluation in which the TEB gas was supplied alone to the wafer, it can be seen that a film was not deposited on the wafer under a condition of the temperature of 325 degrees C. and a film was deposited on the wafer under a condition of the temperatures of 350, 375, and 400 degrees C. In this aspect, it can be seen that the pyrolysis of the DS gas alone within the process chamber can be prevented by performing the film forming sequence illustrated in FIG. 4A under a condition of the temperature of, for example, 250 to 400 degrees C., specifically 250 to 350 degrees C. Moreover, it can be seen that the pyrolysis of the TEB gas alone, as well as the pyrolysis of the DS gas alone within the process chamber, can be prevented by performing the film formation sequence illustrated in FIG. 4A under the condition of the temperature of, for example, 250 to 325 degrees C.

(Step Coverage)

In a third evaluation, an SiBC film was formed on a wafer with a trench formed on its surface by the film forming sequence illustrated in FIG. 4A using the substrate processing apparatus illustrated in FIG. 1. The TEB/DS supply ratio was set to 0.17, 0.2, and 0.5. Other processing conditions were similar to those of the aforementioned embodiment. Furthermore, in a fourth evaluation, an SiBC film was formed on a wafer with a trench formed on its surface by simultaneously supplying the DS gas and the TEB gas to the wafer using the substrate processing apparatus illustrated in FIG. 1. The TEB/DS supply ratio was set to 1. Other processing conditions were similar to those of the third evaluation.

Figure 6B:
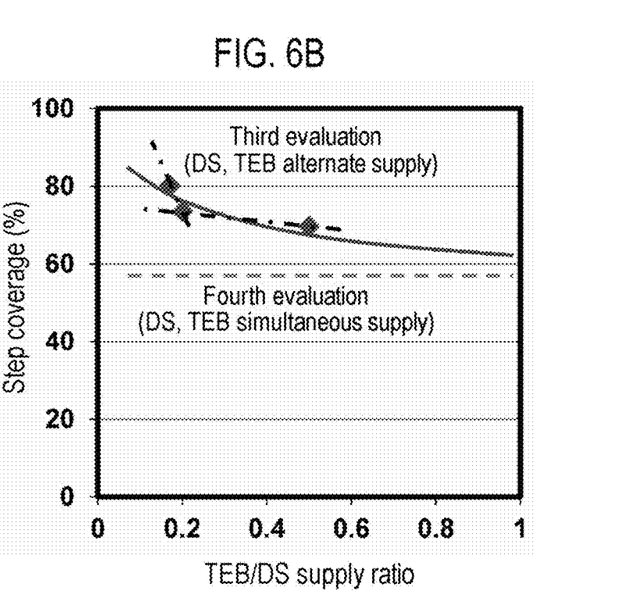

Thereafter, step coverage of the SiBC film formed on the wafers was evaluated. In FIG. 6B, the horizontal axis represents a TEB/DS supply ratio and the vertical axis represents step coverage (%). In the figure, the mark ♦ indicates a measurement result of the third evaluation and the broken line indicates a measurement result of the fourth evaluation. In addition, in FIG. 6B, it indicates that the larger the value on the vertical axis is, the better the step coverage is.

In FIG. 6B, it can be seen that the third evaluation in which the DS gas and the TEB gas are alternately supplied has better step coverage of the SiBC film than the fourth evaluation in which those gases are simultaneously supplied. Moreover, it can be seen that the step coverage of the SiBC film is enhanced as the TEB/DS supply ratio is smaller, namely as the supply amount of the DS gas is larger than the supply amount of the TEB gas. In addition, it can be seen that when the TEB/DS supply ratio is reduced from 0.2 to 0.17, the effect of enhancing step coverage is significantly (discontinuously) increased, compared with a case where the TEB/DS supply ratio is reduced from 0.5 to 0.2 (see the slope of the alternate long and short dash line of the figure). That is, it can be seen that it is possible to sharply increase the effect of enhancing step coverage by setting the TEB/DS supply ratio to 0.2 or less.

According to the present disclosure in some embodiments, it is possible to enhance step coverage of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

forming a silicon boron carbide film on a substrate by causing a first precursor and a second precursor to intermittently react with each other by repeating a cycle a plurality of times, the cycle including alternately performing:

supplying the first precursor, which satisfies an octet rule and has a first pyrolysis temperature, to the substrate in a process chamber to form a first precursor adsorption layer; and supplying the second precursor, which does not satisfy the octet rule and has a second pyrolysis temperature lower than the first pyrolysis temperature, to the substrate in the process chamber such that the first precursor adsorption layer is modified by a reaction between the second precursor and the first precursor adsorption layer, which decomposes the second precursor and the first precursor adsorption layer, wherein in the act of forming the film, a supply amount of the first precursor is set larger than a supply amount of the second precursor, wherein a supply ratio of the supply amount of the second precursor to the supply amount of the first precursor is 0.5 or less, and wherein the act of forming the film is performed under a condition in which the first precursor is not pyrolyzed when the first precursor exists alone, and under a condition in which the second precursor is not pyrolyzed when the second precursor exists alone.

2. The method of claim 1, wherein in the act of forming the film, a supply time of the first precursor is set longer than a supply time of the second precursor.

3. The method of claim 1, wherein in the act of forming the film, a supply flow rate of the first precursor is set larger than a supply flow rate of the second precursor.

4. The method of claim 1, wherein in the act of forming the film, a partial pressure of the first precursor is set greater than a partial pressure of the second precursor.

5. The method of claim 1, wherein in the act of forming the film, a ratio of the supply amount of the second precursor to the supply amount of the first precursor is set to 0.2 or less.

6. The method of claim 1, wherein in the act of forming the film, a ratio of the supply amount of the second precursor to the supply amount of the first precursor is set to 0.17 or less.

7. The method of claim 1, wherein the second precursor has a polarity equal to or higher than a polarity of the first precursor.

8. The method of claim 1, wherein the first precursor contains an element of group 14 and the second precursor contains an element of group 13.

9. The method of claim 1, wherein the first precursor contains silicon and the second precursor contains boron.

10. The method of claim 1, wherein the act of forming the film is performed at a temperature of 250 to 400 degrees C.

11. The method of claim 1, wherein the act of forming the film is performed at a temperature of 250 to 325 degrees C.

12. The method of claim 1, wherein the substrate has a recess on its surface.

13. The method of claim 12, wherein in the act of forming the film, the film is buried into the recess.

14. A non-transitory computer-readable recording medium storing a program configured to cause a substrate processing apparatus to perform a process by a computer in a process chamber of the substrate processing apparatus, the process comprising:

forming a silicon boron carbide film on a substrate by causing a first precursor and a second precursor to intermittently react with each other by repeating a cycle a plurality of times, the cycle including alternately performing:

supplying the first precursor, which satisfies an octet rule and has a first pyrolysis temperature, to the substrate in the process chamber to form a first precursor adsorption layer; and supplying the second precursor, which does not satisfy the octet rule and has a second pyrolysis temperature lower than the first pyrolysis temperature, to the substrate in the process chamber such that the first precursor adsorption layer is modified by a reaction between the second precursor and the first precursor adsorption layer, which decomposes the second precursor and the first precursor adsorption layer, wherein in the act of forming the film, a supply amount of the first precursor is set larger than a supply amount of the second precursor, wherein a supply ratio of the supply amount of the second precursor to the supply amount of the first precursor is 0.5 or less, and wherein the act of forming the film is performed under a condition in which the first precursor is not pyrolyzed when the first precursor exists alone, and under a condition in which the second precursor is not pyrolyzed when the second precursor exists alone.

15. The method of claim 1, wherein the first precursor includes a silicon hydride gas, and the second precursor includes an alkylborane-based gas.

* * * * *